(12) United States Patent
Saeki et al.

(10) Patent No.: US 8,299,480 B2
(45) Date of Patent: Oct. 30, 2012

(54) SEMICONDUCTOR LIGHT EMITTING DEVICE AND METHOD FOR MANUFACTURING SAME, AND EPITAXIAL WAFER

(75) Inventors: Ryo Saeki, Tokyo (JP); Katsufumi Kondo, Tokyo (JP); Yasuo Idei, Tokyo (JP)

(73) Assignee: Kabushiki Kaisha Toshiba, Tokyo (JP)

( * ) Notice: Subject to any disclaimer, the term of this patent is extended or adjusted under 35 U.S.C. 154(b) by 691 days.

(21) Appl. No.: 12/391,283

(22) Filed: Feb. 24, 2009

(65) Prior Publication Data
US 2009/0224269 A1  Sep. 10, 2009

(30) Foreign Application Priority Data

Mar. 10, 2008 (JP) ................... 2008-058996
Apr. 18, 2008 (JP) ................... 2008-109205

(51) Int. Cl.
H01L 33/00 (2010.01)
(52) U.S. Cl. .................. 257/97; 257/E33.032
(58) Field of Classification Search .............. 257/332, 257/340, 368, 199, 94, 194, 200, 85, 201, 257/96, E33.032, E33.027, 12, 97
See application file for complete search history.

(56) References Cited

U.S. PATENT DOCUMENTS

| | | | |
|---|---|---|---|
| 6,586,773 B2 | 7/2003 | Saeki et al. | |
| 6,607,931 B2 | 8/2003 | Streubel | |
| 6,846,686 B2 | 1/2005 | Saeki et al. | |
| 6,987,286 B2 * | 1/2006 | McGill et al. | 257/97 |
| 2001/0028061 A1 * | 10/2001 | Hosoba et al. | 257/76 |
| 2001/0042503 A1 * | 11/2001 | Lo et al. | 117/4 |
| 2002/0036296 A1 | 3/2002 | Akaike et al. | |
| 2002/0144645 A1 * | 10/2002 | Kim et al. | 117/90 |
| 2003/0201449 A1 | 10/2003 | Saeki et al. | |
| 2004/0119078 A1 * | 6/2004 | Konno et al. | 257/79 |
| 2005/0093015 A1 * | 5/2005 | Kurahashi et al. | 257/103 |
| 2005/0285127 A1 | 12/2005 | Noto et al. | |
| 2006/0220031 A1 | 10/2006 | Krames et al. | |
| 2007/0023772 A1 * | 2/2007 | Watanabe et al. | 257/94 |
| 2007/0194296 A1 * | 8/2007 | Murakami et al. | 257/13 |
| 2007/0263687 A1 * | 11/2007 | Takahashi et al. | 372/45.01 |
| 2007/0290203 A1 * | 12/2007 | Saeki | 257/43 |
| 2010/0270568 A1 * | 10/2010 | Suzuki et al. | 257/96 |

FOREIGN PATENT DOCUMENTS

| | | |
|---|---|---|
| JP | 2000-332302 | 11/2000 |
| JP | 2001-144322 | 5/2001 |
| JP | 2004-296707 | 10/2004 |

OTHER PUBLICATIONS

European Search Report for 09 00 3211 mailed on Sep. 22, 2009.
European Office Action for 09003211.1 mailed on Dec. 9, 2009.
Japanese Office Action for 2008-058996 mailed on May 12, 2010.

* cited by examiner

Primary Examiner — Matthew Landau
Assistant Examiner — Latanya N Crawford
(74) Attorney, Agent, or Firm — Turocy & Watson, LLP

(57) ABSTRACT

A semiconductor light emitting device includes: an upper growth layer including a light emitting layer; a transparent substrate through which a radiant light from the light emitting layer passes; and a foundation layer provided between the upper growth layer and the transparent substrate, the foundation layer having a surface-controlling layer and a bonding layer bonded with the transparent substrate. The surface-controlling layer is made of compound semiconductor including at least Ga and As. The upper growth layer is formed on an upper surface of the surface-controlling layer. A lattice constant difference at an interface between the surface-controlling layer and the upper growth layer is smaller than that at an interface between the bonding layer and the transparent substrate.

5 Claims, 12 Drawing Sheets

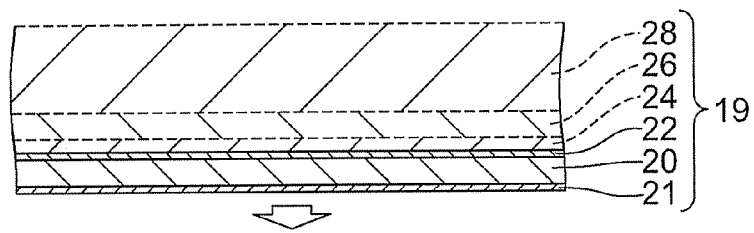
FIG. 14A
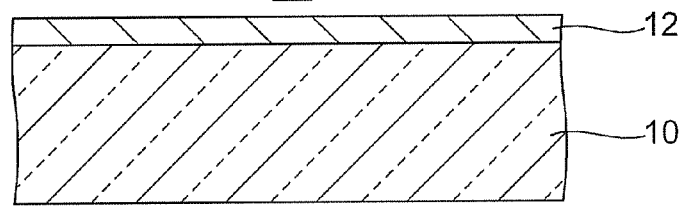
FIG. 14B
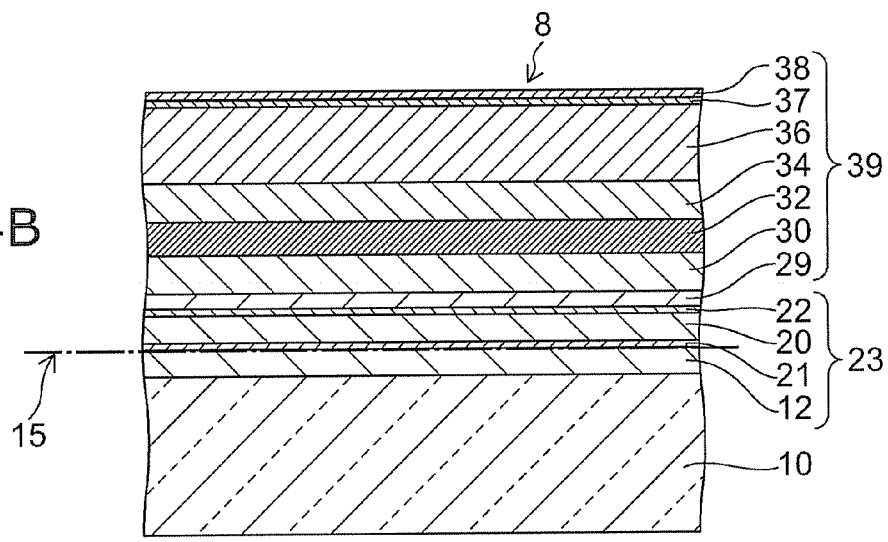
FIG. 14C
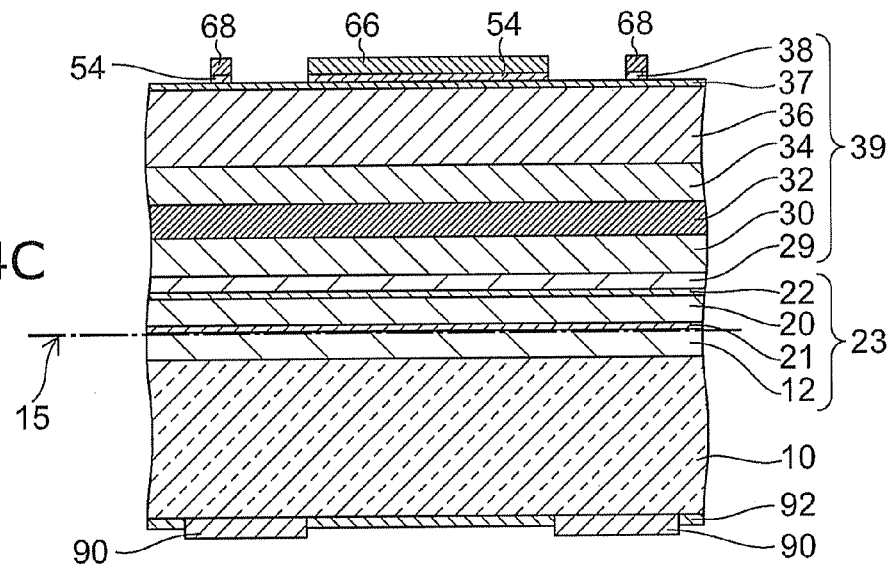

SEMICONDUCTOR LIGHT EMITTING DEVICE AND METHOD FOR MANUFACTURING SAME, AND EPITAXIAL WAFER

CROSS-REFERENCE TO RELATED APPLICATIONS

This application is based upon and claims the benefit of priority from the prior Japanese Patent Application No. 2008-058996, filed on Mar. 10, 2008, and the prior Japanese Patent Application No. 2008-109205, filed on Apr. 18, 2008; the entire contents of which are incorporated herein by reference.

BACKGROUND OF THE INVENTION

1. Field of the Invention

This invention relates to a semiconductor light emitting device and a method for manufacturing the same, and an epitaxial wafer.

2. Background Art

A light emitting device emitting visual light, such as green, yellow-green, yellow, orange, and red, has been widely used in such applications as lighting apparatus, car-use lighting equipment, display device, traffic signal, and so on. If a light emitting device can be brighter, outdoor applications can extend, and also low consumption power becomes possible due to a reduction of an operating current.

If a light emitting layer of the semiconductor light emitting device is formed on a GaAs substrate having band gap wavelength of approximately 870 nm longer than that of a visual light wavelength range of green to red, a radiant light toward the GaAs substrate is absorbed and an optical output power is reduced.

On the contrary, if a GaP substrate having a band gap wavelength of 550 nm shorter than that of visual light wavelength range of yellow-green to red is used, the absorption in the GaP substrate is reduced and high intensity becomes possible.

However, because a lattice constant difference between InGaAlP-based base semiconductor which emits visual light having a wavelength range of yellow-green to red and GaP material is approximately several percents, it is difficult that a laminate body, made of InGaAlP, having low crystal defect density is directly grown on the GaP substrate.

There is disclosed a technique which provides a light emitting device having high light emitting efficiency while avoiding undesirable influence to light emitting portion due to heat treatment in wafer bonding process (JP-A 2001-144322 (Kokai)). In this disclosure example, there is disclosed a method for manufacturing a semiconductor light emitting device comprising; growing a first semiconductor layer on a first substrate in a lattice fitting state, detaching the first substrate after bonding the first semiconductor layer and a second substrate, and growing a second semiconductor layer on the first semiconductor layer bonded to the second substrate. In this case, a lattice misfit can be relaxed because the first semiconductor layer is provided.

However, when the first semiconductor layer is made of InGaAlP based material, its surface tends to be unstable, and therefore, crystal defect density tends to be higher.

SUMMARY OF THE INVENTION

According to an aspect of the invention, there is provided a semiconductor light emitting device including: an upper growth layer including a light emitting layer; a transparent substrate through which a radiant light from the light emitting layer passes; and a foundation layer provided between the upper growth layer and the transparent substrate, the foundation layer having a surface-controlling layer and a bonding layer bonded with the transparent substrate, the surface-controlling layer being made of compound semiconductor including at least Ga and As, the upper growth layer being formed on an upper surface of the surface-controlling layer, and a lattice constant difference at an interface between the surface-controlling layer and the upper growth layer being smaller than that at an interface between the bonding layer and the transparent substrate.

According to another aspect of the invention, there is provided a method for manufacturing a light emitting device having: an upper growth layer including a light emitting layer; a transparent substrate through which a radiant light from the light emitting layer passes; and a foundation layer provided between the upper growth layer and the transparent substrate, the foundation layer having a surface-controlling layer and a bonding layer bonded with the transparent substrate, the surface-controlling layer being made of compound semiconductor including at least Ga and As, the upper growth layer being formed on an upper surface of the surface-controlling layer, and a lattice constant difference at an interface between the surface-controlling layer and the upper growth layer being smaller than that at an interface between the bonding layer and the transparent substrate, the method comprising: performing crystal growth of a buffer layer, the surface controlling layer, and the bonding layer, in this order on a first substrate; bonding a face of the bonding layer and the transparent substrate in a heated state; removing the first substrate and the buffer layer; performing crystal growth of the upper growth layer on the surface controlling layer.

According to another aspect of the invention, there is provided an epitaxial wafer comprising: a GaP substrate having a carrier concentration range of $3\times10^{17}$ to $1\times10^{18}$ cm$^{-3}$; a bonding layer, a first face of the bonding layer being bonded with the GaP substrate in a heated state; and an upper growth layer grown on a side of a second face of the bonded layer, the second face being opposite to the first face, the upper growth layer having a light emitting layer emitting a light which passes through the GaP substrate, a density of surface hillocks having diameters of not less than 10 μm on the upper growth layer being not more than 490 per 2-inch diameter, a lattice constant difference between the upper growth layer and the bonding layer being smaller than that between the GaP substrate and the bonding layer.

BRIEF DESCRIPTION OF THE DRAWINGS

FIGS. 14A to 14C are views explaining a semiconductor light emitting device according to a second modified example of the second embodiment.

DETAILED DESCRIPTION OF THE INVENTION

Embodiments of the invention will now be described with reference to the drawings.

Figure 1:
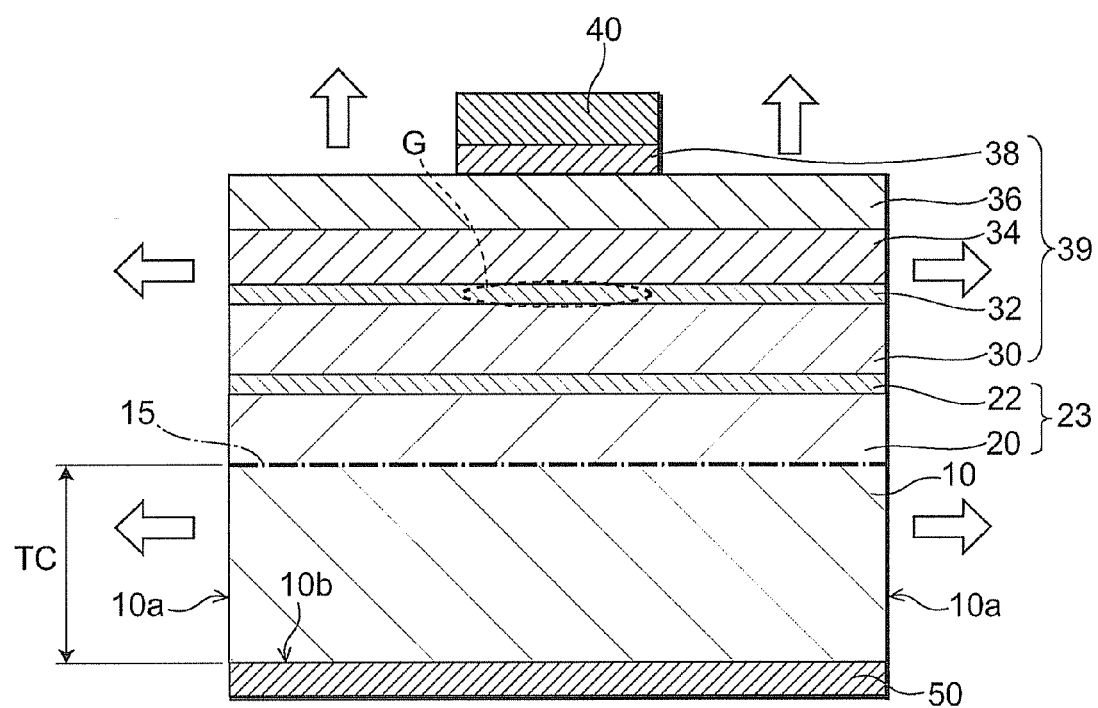
FIG. 1 is a cross-sectional view schematically showing a semiconductor light emitting device according to a first embodiment of the invention.

FIG. 1 is a cross-sectional view schematically showing a semiconductor light emitting device according to a first embodiment of the invention.

A transparent substrate 10 has high transmissivity in a radiant light wavelength range from the semiconductor light emitting device, and can avoid absorption of radiant light. Therefore, a higher optical power can be outputted. In this embodiment, the semiconductor light emitting device has the light emitting layer 32 made of InGaAlP-based material and the transparent substrate 10 made of GaP. However, this invention is not limited thereto.

Note that the "InGaAlP" used herein includes semiconductors having any composition represented by a chemical formula of $In_x(Ga_yAl_{1-y})_{1-x}P$ (where $0 \leq x \leq 1$, $0 \leq y \leq 1$). Furthermore, the "InGaAlP" also includes semiconductors further containing p-type and n-type impurities added for controlling conductivity types.

When an n-type GaP material, having approximately 550 nm band gap wavelength, is used as a transparent substrate 10, a radiant light from InGaAlP-based material, having wavelength of 550 to 700 nm, can pass through the transparent substrate 10 while avoiding absorption. On the other hand, because green light wavelength, within the range of 510 to 540 nm, is slightly shorter than the band gap wavelength of GaP, the transmissivity thereof becomes slightly lower. However, because the transmissivity is higher than that of the GaAs substrate, the higher optical power can be obtained. Furthermore, a bottom electrode 50 can be provided on a bottom face of the transparent substrate 10 because the n-type GaP is conductive.

The visual radiant light can pass when a ZnO substrate having band gap wavelength of approximately 368 nm is used. Also, the radiant light having wavelength of 550 nm or more can pass, when a ZnSe substrate is used.

An upper face of the transparent substrate 10 of 250 μm thick and a foundation layer 23 are bonded at an interface 15 therebetween. For example, the foundation layer 23 has a bonded layer 20 of an n-type InGaAlP film 0.5 μm thick, and a surface controlling layer 22 of an n-type GaAs film 20 nm thick. The transparent substrate 10, on which the foundation layer 23 is bonded, is used as a foundation substrate for crystal growth. An upper growth layer 39 is formed on the surface controlling layer 22. And a lattice deviation at the interface between the surface controlling layer 22 and the upper growth layer 39 is smaller than that at an interface between the foundation layer 23 and the transparent substrate 10. Note that the "lattice deviation" is, for example, defined as the difference of lattice constants between the semiconductors constituting respective layers.

The upper growth layer 39 is formed on the foundation layer 23. That is, the upper growth layer 39 has a double hetero structure in which an n-type InAlP cladding layer 30 (T=0.6 μm, N=4×10$^{17}$ cm$^{-3}$), an InGaAlP light emitting layer 32 (T=0.6 μm), a p-type InAlP cladding layer 34 (T=0.6 μm, N=4×10$^{17}$ cm$^{-3}$), a p-type $In_{0.5}(Ga_{0.3}Al_{0.7})_{0.5}P$ current spreading layer 36 (T=1.5 μm, N=1.5×10$^{18}$ cm$^{-3}$), and a p$^+$-type GaAs contact layer 38 (T=0.1 μm, N=2×10$^{18}$ cm$^{-3}$) are formed in this order, where T denotes thickness and N denotes carrier concentration.

When the light emitting layer 32 is composed of $In_{0.5}(Ga_yAl_{1-y})_{0.5}P$ Multiple-Quantum Well (MQW), it becomes easy to improve controllability of radiant light wavelength and to reduce a threshold current. In this case, for example, Ga constitution ratio y may be 0.96 in a well layer and width thereof may be 5 nm. On the other hand, Ga constitution ratio y may be 0.2 in a barrier layer and width thereof may be 8 nm. And 40 pair MQW may be provided. Also, impurity concentration, in the well and the barrier layers, may be 8×10$^{16}$ cm$^{-3}$, respectively. Thus, a red light of approximately 620 nm wavelength can radiate, and absorption of the red light can be avoided in the transparent substrate 10 because the red light wavelength is longer than the band gap wavelength of the GaP substrate 10. Furthermore, in the case of visual light such as orange, yellow, yellow-green, and green, the structure and its constitution ratio of the light emitting layer 32 can be appropriately determined.

Because deviation of lattice constants is several percent with respect to InGaAlP, it is difficult to form InGaAlP-based growth layer directly on the GaP substrate with high quality so as to avoid crystal defects. By contrast, in this embodiment, a surface controlling layer 22, made of n-type GaAs, having thickness of 50 nm or less, is formed on the bonding layer of n-type InGaAlP 20 of which lattice approximately fits to GaAs. Therefore, it becomes easy to form the upper growth layer 39 of which lattice constant fits to that of the foundation layer 23 and the crystal defects including dislocation are reduced.

Furthermore, the upper growth layer 39 can be formed while keeping its surface stable because the material of the surface controlling layer 22 is made of III-V group compound semiconductor, such as GaAs, which does not substantially include such element as In, Al, and P as a mixed crystal constituting elements. That is, it makes easy to fit lattice by interposing the bonding layer 20, and keep the surface of the foundation layer 23 stable by forming the thin surface controlling layer 22. The surface controlling layer 22, including Ga and As, may further include small amount of other elements, such as In, Al, and P, if substantial influence is not induced.

Figure 2:
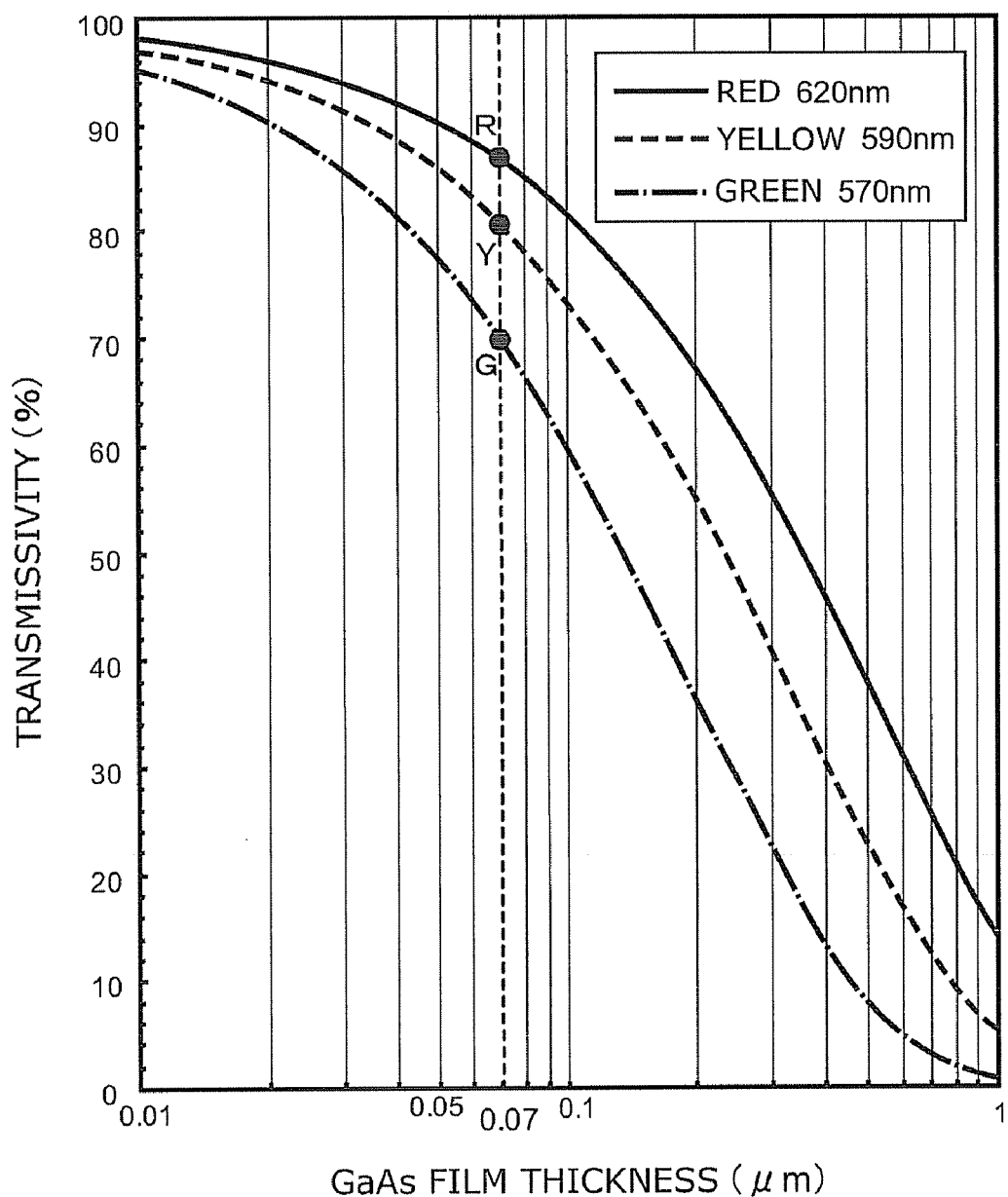
FIG. 2 is a graphical diagram representing dependence of the transmissivity on GaAs film thickness.

FIG. 2 is a graphical diagram representing the dependence of transmissivity on GaAs film thickness.

The vertical axis represents transmissivity (%), and horizontal axis represents GaAs film thickness (μm). The transmissivity of the red light of 620 nm wavelength is represented by the solid line. The transmissivity is about 98% at a GaAs film 0.01 μm thick, falls to about 88% (point R) at a film 0.07 μm thick, and further falls to about 83% at a film 0.1 μm thick.

By contrast, the transmissivity of the yellow light of 590 nm wavelength is represented by the broken line. The transmissivity is about 97% at a film 0.01 μm thick, falls to about 81% (point Y) at a film 0.07 μm thick, and further falls to about 74% at a film 0.1 μm thick. Also, the transmissivity of the green light of 570 nm wavelength is represented by the chained line. The transmissivity is about 95% at a film 0.01 μm thick, falls to about 70% (point G) at a film 0.07 μm thick, and further falls to approximately 60% at a film 0.1 μm thick. Thus, the shorter the wavelength, the lower the transmissivity. Therefore, it is preferable that the thickness of the surface controlling layer 22 is not more than 0.07 μm (70 nm), in order to maintain the transmissivity more than 70% so as to maintain high intensity even for the green light.

On an upper face of the contact layer 38, an upper electrode 40, made of AuZn or the like, is formed by using lift off patterning method. Also, on a bottom face of the transparent substrate 10, a bottom electrode 50, made of AuGe or the like, is formed. Additionally, the contact layer 38 left only under the upper electrode 40 forms the low-resistance ohmic contact with the upper electrode 40.

Furthermore, the current density in the region under the upper electrode 40 is higher than that in the outer region, and the region under the electrode 40 functions as the light emitting region G, although the injected current spreads easily along the face of the light emitting layer 32 due to lower resistance of the current spreading layer 36. The radiant light from the light emitting region G travels upward except the upper electrode 40, and towards the side direction from the chip. The substrate 10 of n-type GaP is transparent and conductive. Therefore, absorption of the emitted light downward from the light emitting region G can be prevented in the transparent substrate 10. There are a light directly emitted from the side face 10a of the transparent substrate 10 and a light emitted from the side 10a after reflection by the bottom electrode 50 at the bottom face 10b, of the incident light into the transparent substrate 10 from the light emitting layer 32.

It is important to enhance the radiant light towards the side direction because thickness TC of the transparent substrate 10 is as thick as 100 to 300 μm, compared to that of 10 μm or less of the upper growth layer 39, in the cross-section of the actual light emitting device chip.

Figure 3A:
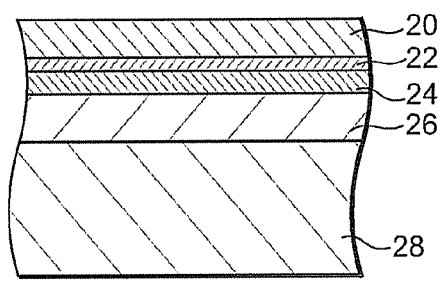
FIGS. 3A to 3D are process sectional views showing a method for manufacturing a foundation layer of a light emitting device according to the first embodiment.

FIGS. 3A to 3D are the process sectional views of forming the foundation substrate in the method for manufacturing the semiconductor light emitting device according to the first embodiment. First, as shown in FIG. 3A, an n-type GaAs buffer layer 26 (T=0.5 μm), an n-type InGaAlP buffer layer 24 (T=0.5 μm), an n-type GaAs surface controlling layer 22 (T=20 nm, for example), and an n-type InGaAlP bonding layer 20 (T=0.5 μm) are formed in this order by using the epitaxial crystal growth process, on the first substrate of n-type GaAs 250 μm thick. In this case, the n-type InGaAlP bonding layer 20 approximately fits to lattice constant of GaAs. Moreover, although an n-type InGaAlP buffer layer 24 can be formed directly on the first substrate 28, it becomes easy to reduce the crystal defects if an n-type GaAs buffer layer 26 is interposed between the first substrate 28 and the n-type InGaAlP buffer layer 24.

At least any one crystal growth method can be used, of MOCVD (Metal Organic Chemical Vapor Deposition), MBE (Molecular Beam Epitaxy), vapor phase growth and so on.

In the case of MOCVD method, such organic metals compound as TMG (trimethylgallium), TMA (trimethylaluminum), and TMI (trimethylindium) are used, and such hydrogen gases as $AsH_3$ and $PH_3$ are used. And the crystal growth temperature is set to be about 700° C. Moreover, Zn and Mg can be used as a p-type impurity, and Si is used as an n-type impurity. A source material of Zn is DMZ or DEZ, a source material of Mg is $Cp_2Mg$, a source material of C is $CBr_4$, and a source material of Si is $SiH_4$, for example, preferably.

Figure 3B:
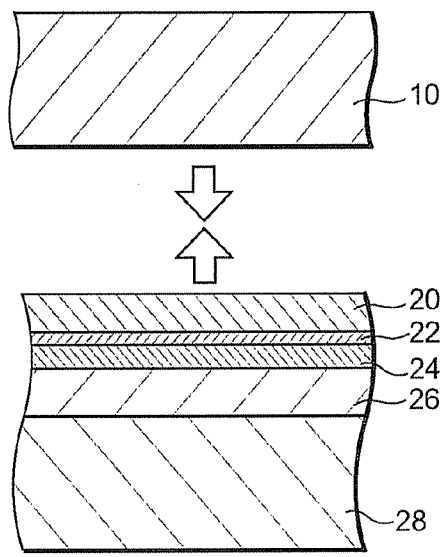

Subsequently, as FIG. 3B, the n-type GaP transparent substrate 10 and the n-type InGaAlP bonding layer 20 are opposed and contacted in a wafer state, and bonded by the heat treatment in a hydrogen or inactive gas atmosphere. The appropriate temperature for the heat treatment is preferably within the range of 770 to 830° C., and more preferably 800° C., for example. In this case, a bonding interface 15 is represented by the chained-line.

Figure 3C:
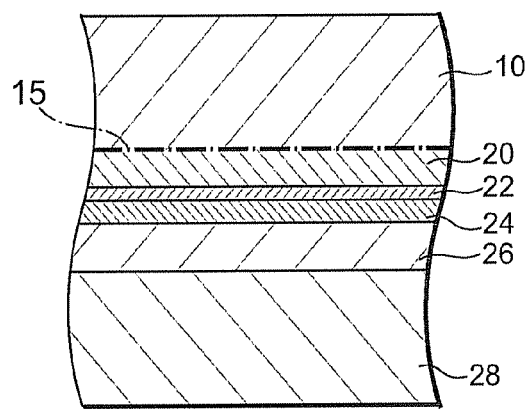

FIG. 3C represents a cross-sectional view after the wafer bonding process. The bonding layer 20 and the surface controlling layer 22 fit approximately to GaAs of which lattice constant is approximately 5.6533 angstroms, and misfit to the transparent substrate 10 of which lattice constant is 5.4512 angstroms. That is, because dislocations or the like can be easily induced in the region, adjacent to the bonding layer 20, of the transparent substrate 10, deviation of lattice constants can be relaxed. Thus, by forming the foundation layer 23, it can be prevented that such crystal defects as dislocations, induced near the bonding interface adjacent to the transparent substrate 10, extend into the upper growth layer 39.

Figure 3D:
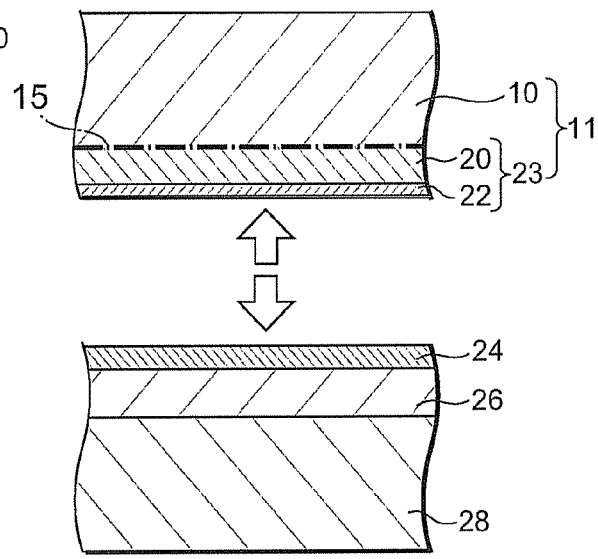

Moreover, as FIG. 3D, the laminate body including the first substrate 28, the n-type GaAs buffer layer 26, and the n-type InGaAlP buffer layer 24, is removed by using at least any one of the mechanical polishing method and the solution etching method. Thus, the foundation substrate 11 can be obtained which is formed by laminating the foundation layer 23 having the bonding layer 20 and the surface controlling layer 22 on the transparent substrate 10. In this case, the n-type InGaAlP bonding layer 20 misfits to the lattice of the transparent substrate 10. Additionally, if the n-type InGaAlP buffer layer 24 is removed by selectively etching method, it becomes easy to leave surely the surface controlling layer 22 being as thin as 70 nm or less.

Figure 4A:
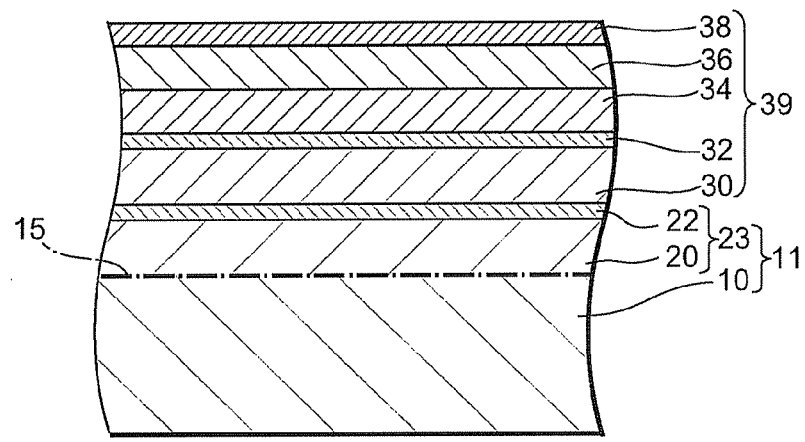
FIGS. 4A to 4C are process sectional views showing a method for manufacturing the semiconductor light emitting device of the first embodiment.
Figure 4B:
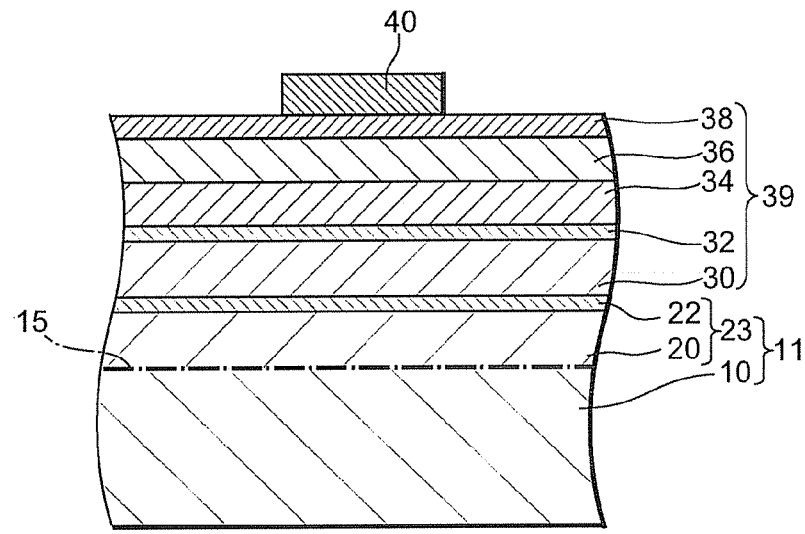
Figure 4C:
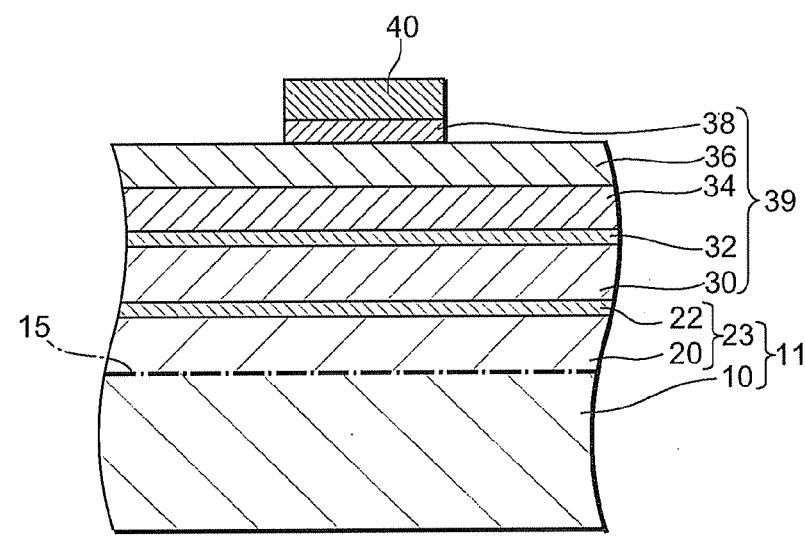

FIGS. 4A to 4C are the process sectional views after forming the upper growth layer on the foundation substrate, of the method for manufacturing light emitting device. First, shown as in FIG. 4A, on the surface controlling layer 22 constituting the face of the foundation layer 23, the upper growth layer 39 in which the n-type InGaAlP cladding layer 30 is a starting layer is formed. The upper growth layer 39 is made of InGaAlP except the top of the $p^+$-type GaAs contact layer 38. The crystal growth temperature is set to be about 700° C. in the case of MOCVD method.

Assume that the upper growth layer 39 is formed at about 700° C. on the GaAs substrate and subsequently is bonded with the GaP substrate at about 800° C. Then, if Zn is used as a p-type impurity, the crystal quality degrades due to Zn diffusion during the heat treatment process of which temperature, about 800° C., is higher than the upper growth layer forming temperature, about 700° C., resulting in the optical power reduction.

On the contrast, when the upper growth layer 39 is formed on the foundation substrate 11 at temperature lower than the bonding temperature in this embodiment, the constitution and the carrier concentration of the upper growth layer 39 can be kept stable while maintaining good ohmic contact, and higher optical power can be obtained preferably.

Moreover, because the surface controlling layer 22 does not substantially include In easily causing non-uniformity due to aggregation, Al easily oxidizing, and P having higher vapor pressure, the face of the foundation substrate 11 can be maintained stable with better reproducibility immediately before forming the upper growth layer 39. Therefore, the upper growth layer 39 reducing the crystal defects can be formed. If the upper growth layer 39 is successively formed in the same vacuum chamber, the crystal defects can be reduced and contamination can be prevented preferably. Furthermore, if the MOCVD apparatus can automatically switch gases, the upper growth layer 39 can be formed with high accuracy of film thickness and better reproducibility, and mass productivity is achieved easily. III-V group compound semiconductor which does not including In, Al, and P as mixed crystal constitution elements is, for example, GaSb or GaN.

Subsequently, as shown in FIG. 4B, the upper electrode 40 is formed on the contact layer 38. And, as shown in FIG. 4C, a region on which the upper electrode 40 is not formed is removed by the solution etching method or the like. If the GaAs contact layer 38 is left on the whole chip surface, the radiant light is absorbed and the light upward lowers. Therefore, it is preferable to remove the GaAs contact layer in the outer region. Subsequently, the bottom electrode 50 is formed on the bottom face of the transparent substrate 10 and the wafer manufacturing process is ended.

Figure 5:
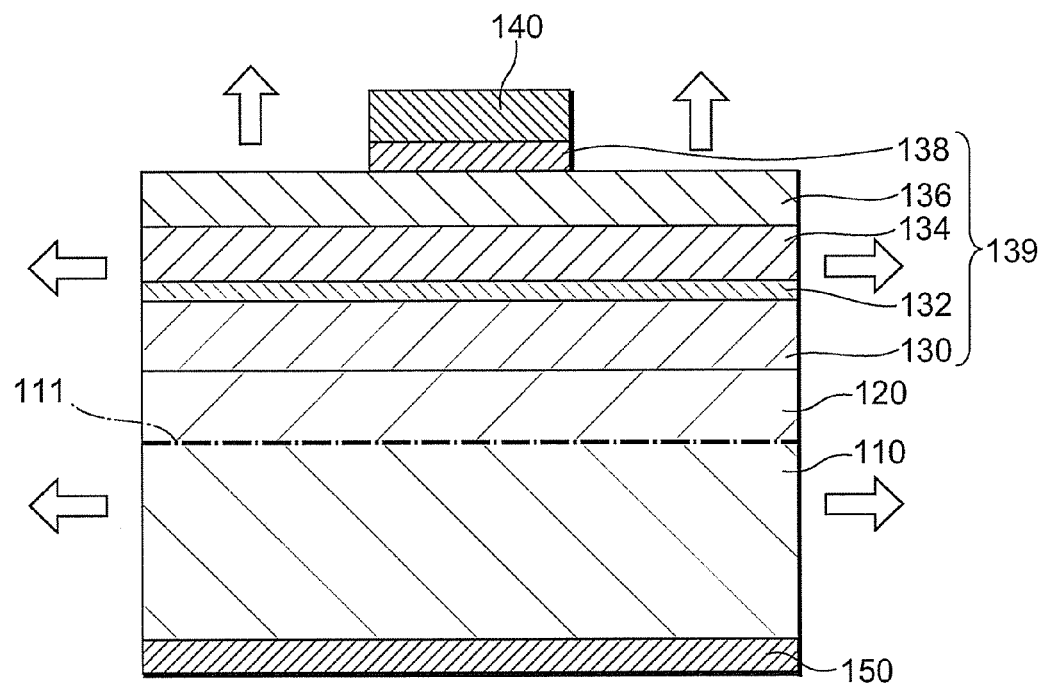
FIG. 5 is a cross-sectional view schematically showing a semiconductor light-emitting device according to a first comparative example.

FIG. 5 is a cross-sectional view schematically showing the semiconductor light emitting device according to a first comparative example. That is, an n-type InGaAlP bonding layer 120 is bonded with a GaP substrate 110 at a bonding interface 111. An upper growth layer 139, starting from an n-type cladding layer 130, is formed on the bonding layer 120. Al oxidation, In aggregation, and P evaporation are induced at the surface and its control becomes difficult because the bonding layer 120 is a mixed crystal including In, Al, and P. Therefore, the oxide layers and inequalities are easily induced on the surface of the bonding layer 120 due to instability.

That is, crystal defects are easily induced, which include such the point defect as an interstitial atom and vacancy, dislocation, and stacking fault even in the growth layer 139, formed on the bonding layer 120 capable of fitting lattice. Thus, crystal defect density becomes higher, non-radiative recombinations increase, and optical power lowers. Specifically, as injected carriers recombine by the operation, for example, the crystal defects are expanding while forming dark lines into the light emitting layer 132, resulting in the optical power reduction with the operating time.

Figure 6:
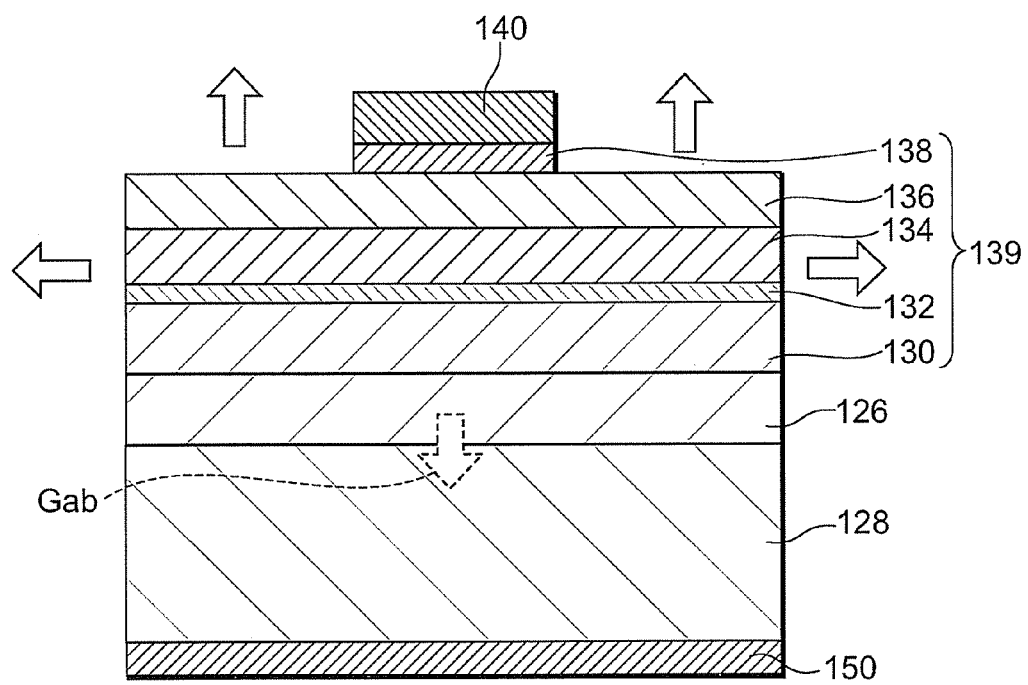
FIG. 6 is a cross-sectional view schematically showing a semiconductor light emitting device according to a second comparative example.

FIG. 6 is a cross-sectional view schematically showing a semiconductor light emitting device according to a second comparative example. That is, the foundation substrate is provided, in which the n-type GaAs buffer layer 126 is formed on the n-type GaAs foundation substrate 128 of 250 μm thick. And the upper growth layer 139 is formed on the foundation substrate. In this case, although the manufacturing method may be simple due to no wafer bonding process, absorption of the light Gab towards the substrate 128 is induced and optical power from the side of the substrate 128 lowers, and therefore, it becomes difficult to obtain higher optical power.

Table. 1 represents comparison of crystal defect density and relative optical power after operating.

TABLE 1

| CASE | DEFECT DENSITY (cm$^{-2}$) | RELATIVE OPTICAL POWER AFTER OPERATING |
| --- | --- | --- |
| THIS EMBODIMENT | 3 × 10$^3$ ON AVERAGE | 90% OR MORE |
| 1ST COMPARATIVE EXAMPLE | 1 × 10$^6$ OR MORE | 50% OR LESS |
| 2ND COMPARATIVE EXAMPLE | 1 × 10$^3$ OR MORE | 90% OR MORE |

In the first comparison example, the relative optical power lowered to 50% or less after 100 hour operation. This is because the crystal defects expand into the light emitting layer 132, which is induced due to an instability including oxide film and inequalities on the surface of the bonding layer 120. In this case, the crystal defect density becomes large to 1×10$^{16}$ cm$^{-2}$ or more. Thus, if the surface of the bonding layer 120 is instable, reproducibility and uniformity in the crystal growth process becomes worse and it becomes difficult to maintain higher yield and mass productivity.

In the second comparison example, because the upper growth layer 139 was formed on the GaAs substrate 128 having a stable surface, crystal defect density could be lowered to 1×10$^3$ cm$^{-2}$ and the relative power could be maintained 90% or more. However, it was difficult to obtain high intensity because optical power was as low as 35 to 50% of this embodiment of this invention due to absorption in the GaAs substrate.

Because the GaP transparent substrate 10 is used in these embodiments, the optical power can be higher compared to that of the second embodiment. Moreover, the surface controlling layer 22 of the foundation substrate 11 is stable due to semiconductor, such as GaAs including at least Ga and As, having a stable surface when forming the upper growth layer 39, including the light emitting layer 32, starts. Therefore, because the crystal defect density can be 3×10$^3$ cm$^{-2}$ on average, and is lower than that of the first comparative example, high quality epitaxial crystal with better reproducibility and uniformity becomes possible. As the result, the optical power reduction can be prevented and higher reliability can be kept easily in long operating time. Furthermore, the manufacturing method capable of maintaining higher yield and mass productivity becomes possible.

Figure 7A:
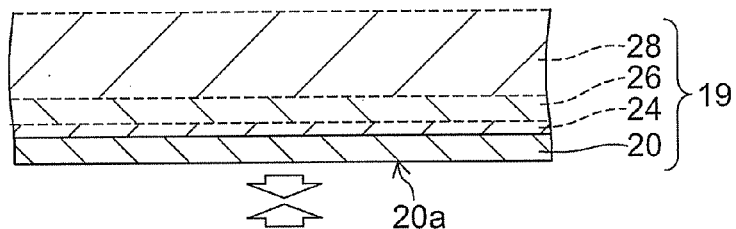
FIGS. 7A to 7C are process sectional views showing a method for manufacturing a semiconductor light emitting device according to a second embodiment.
Figure 7B:
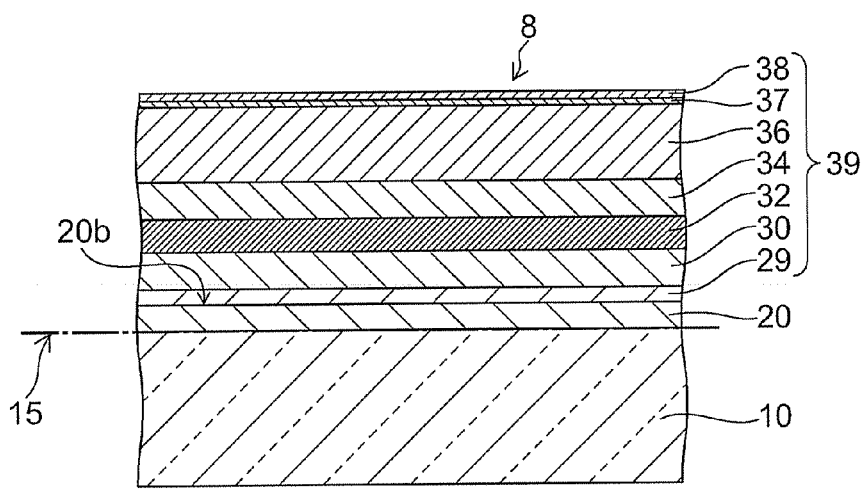
Figure 7C:
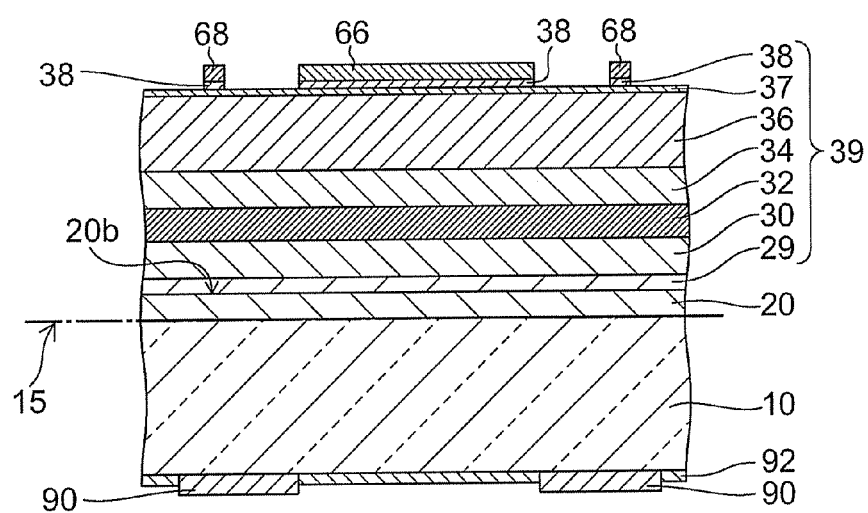

FIGS. 7A to 7C are views representing a semiconductor light emitting device according to a second embodiment. That is, FIG. 7A is a view explaining the bonding process with the GaP substrate, FIG. 7B is a cross-sectional view of an epitaxial wafer having the upper growth layer formed on the foundation layer, and FIG. 7C is a cross-sectional view of the light emitting device.

Figure 8:
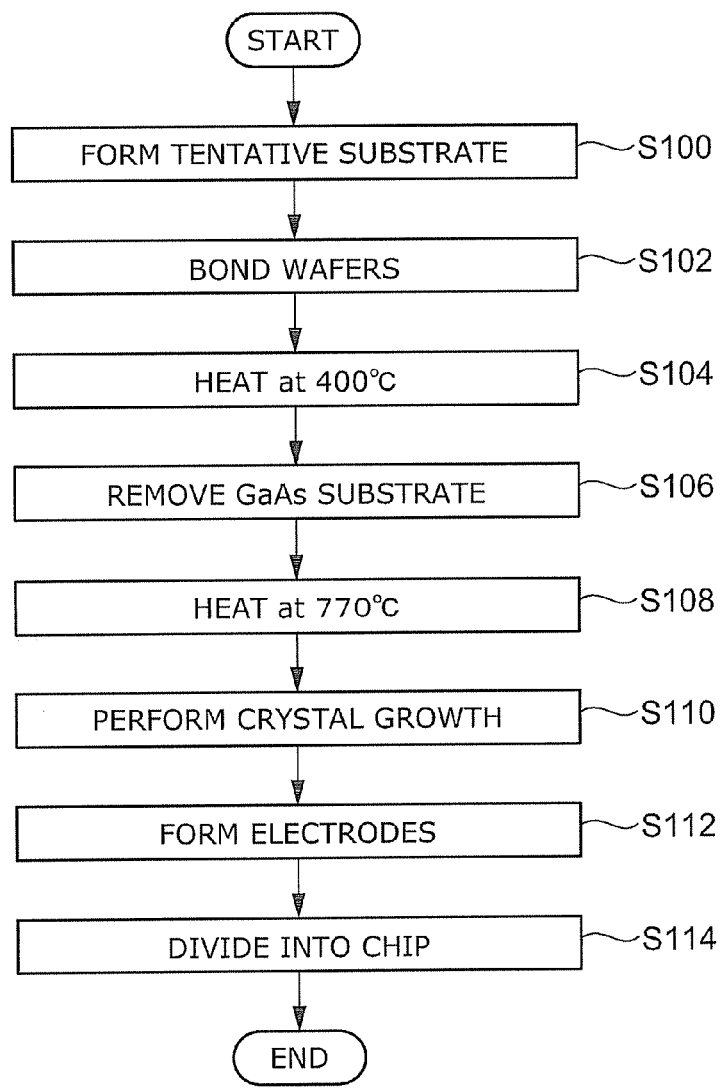
FIG. 8 is a flow chart of a method for manufacturing a semiconductor light emitting device according to a second embodiment.

Moreover, FIG. 8 is a flow chart representing the method for manufacturing the light emitting device.

First, there are provided an InGaP buffer layer 26, an In$_{0.5}$(Ga$_{0.3}$Al$_{0.7}$)$_{0.5}$P buffer layer 24 (T=50 nm) having etching stop function, and an n-type In$_{0.5}$(Ga$_{0.5}$Al$_{0.5}$)$_{0.5}$P first bonding layer 20 (T=0.3 μm, N=4×10$^{17}$ cm$^{-3}$), on the GaAs substrate 28, in this order, where T is thickness and N is carrier concentration. The tentative substrate 19 is formed (S100). In this crystal growth process, at least any one method of MOCVD, MBE, and so on is used.

It is preferable that a substrate, bonded with the tentative substrate 19, is made of a transparent GaP single crystal and its carrier concentration is within the range of 3×10$^{17}$ to 1×10$^{18}$ cm$^{-3}$, especially 3×10$^{17}$ to 8×10$^{17}$ cm$^{-3}$. Moreover, if a surface orientation of the GaP substrate 10 is 3 to 20° off from (100) surface towards [011] or [−011] direction, crystallinity can be improved. However, this invention is not limited thereto. Moreover, although the buffer layers 24, 26 can be omitted, it becomes easy to remove a GaAs substrate 28 if the buffer layers 24, 26 are formed.

Subsequently, a first face 20a of the bonding layer 20 is cleaned by using an appropriate preparation process. On the other hand, the upper face of the GaP substrate 10 having a mirror finished face of roughness (maximum value of R) less than 10 nm is cleaned by removing a natural oxide film using, for example, diluted hydrofluoric acid and so on, and by washing. Thus, a bonding interface 15 can be obtained, at which insufficiently bonded area due to the natural oxide film and unwanted micro particles are prevented.

After opposing the first face 20a of the first bonding layer 20 and the upper face of the GaP substrate 10 (S102), they are bonded (S104). After bonding, the GaAs substrate 28 is removed by using solution etching method, for example, and the surface of the buffer layer is exposed (S106). Next, the better bonding characteristic including ohmic characteristic and bonding strength is obtained by heating at about 770° C. (S108). If the warp of the GaP substrate 10 is 20 μm or less in 2 inch wafer size and 50 μm or less in 3 inch wafer size, it becomes easy to reduce the insufficiently bonded area.

Immediately before forming the upper growth layer 39 including the light emitting layer 32, the buffer layer 24 is removed, and therefore, the second face 20a of the first bonding layer 20 is exposed. There are formed, on the second face 20b cleaned, an InGaAlP buffer layer 29 (N=4×10$^{17}$ cm$^{-3}$), an n-type InAlP cladding layer 30 (T=0.6 μm, N=4×10$^{17}$ cm$^{-3}$), a p-type In$_{0.5}$(Ga$_x$Al$_y$)$_{0.5}$P light emitting layer 32 (N=8×10$^{16}$ cm$^{-3}$), a p-type InAlP cladding layer 34 (T=0.6 μm, N=4×10$^{17}$ cm$^{-3}$), a p-type In$_{0.5}$(Ga$_{0.3}$Al$_{0.7}$)$_{0.5}$P current spreading layer 36 (T=1.5 μm, N=1.5×10$^{18}$ cm$^{-3}$), a p-type In$_{0.5}$(Ga$_{0.7}$Al$_{0.3}$)$_{0.5}$P intermediate layer 37 (T=10 nm, N=1.5×10$^{18}$ cm$^{-3}$), and a p-type GaAs contact layer 38 (T=0.1 μm, N=2×10$^{18}$ cm$^{-3}$), in this order, by using at least any one of MOCVD method, MBE method and so on. Thus, the upper growth layer 39 can be formed as the laminated body (S110).

When the light emitting layer 32 is MQW structure, it becomes easy to reduce the operation voltage and control the radiant light wavelength. For example, the MQW structure can be composed of 40 pairs of the well layer, having constitution ratio of x=0.96 and y=0.04, and width of 5 nm, and the barrier layer, having constitution ratio of x=0.2 and y=0.8, and width of 8 nm.

In FIG. 7, the lattice difference between the first bonding layer 20 and the upper growth layer 39 is smaller than that between the first bonding layer 20 and the GaP substrate 10. That is, the lattice constant of GaP is approximately 5.451 angstrom, whereas that of GaAs is approximately 5.6533 angstrom. In this case, the first bonding layer 20 and the upper growth layer 39 fit approximately with GaAs lattice. Thus, the lattice of the GaP substrate 10 is relaxed by dislocation introduced near the bonding interface 15. Therefore, it is prevented that the crystal defects induced near the bonding interface 15 expand into the upper growth layer 39. The "lattice deviation" is defined as the difference between the lattice constants of semiconductors constituting each layer, herein.

In the epitaxial wafer 8 shown in FIG. 7C, an AuZn bonding electrode 66 of 100 μm diameter and an AuZn narrow electrode 68 of 3 μm wide are formed, on the contact layer 38, by using lift off method. Moreover, an AuGe bottom electrode 90 is formed by using the lift off method on the bottom of the GaP substrate 10 (S112). In this case, if the covering ratio of the bottom electrode to the area of the bottom of the GaP substrate 10 is, for example, approximately 30% and reflecting layer 92 is formed in the other area of the bottom of the GaP substrate 10, optical absorption can be reduced at the bottom electrode 90. Subsequently, after forming ohmic contact with the semiconductor in the bonding electrode 66, the narrow electrode 68, and the bottom electrode 90 by using RTA heat treatment method in 450° C., the contact layer 38 except the region covered with the bonding electrode 66 and the narrow electrode 68 is removed, resulting in reduction of optical absorption. Furthermore, dicing and chip division are performed and crushed layers are removed by using the etching method with hydrochloric acid based solution (S114).

Thus, the semiconductor light emitting device can be obtained as shown in FIG. 7C.

Figure 9A:
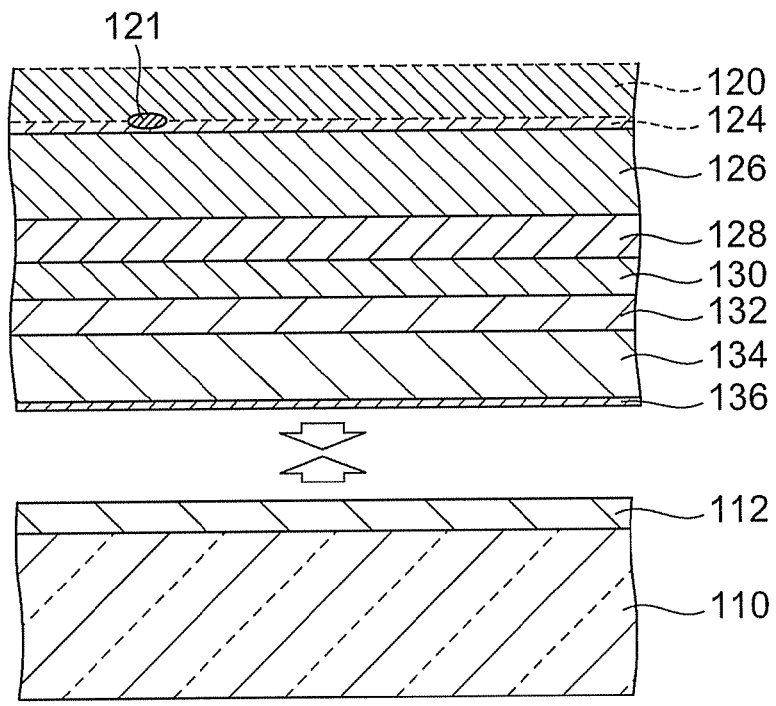
FIGS. 9A and 9B are cross-sectional views schematically explaining a semiconductor light emitting device according to a third comparative example.
Figure 9B:
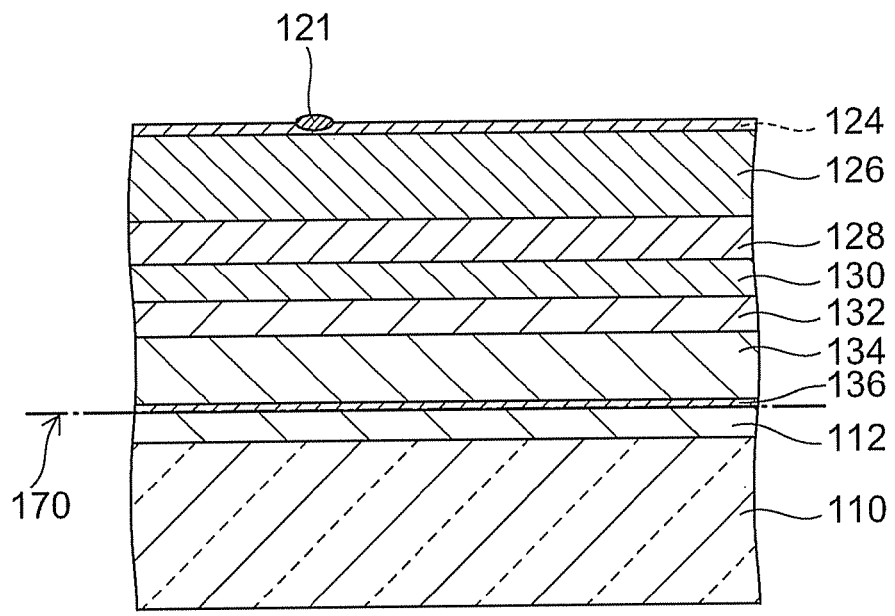

FIGS. 9A and 9B are cross-sectional views schematically explaining a semiconductor light emitting device according to a third comparative example. That is, FIG. 9A is a view explaining the bonding process, and FIG. 9B is a cross-sectional view of the epitaxial wafer after bonding.

The light emitting device according to this comparative example a p-type GaP bonding layer 112 is formed on a p-type GaP substrate 110 having an opposite conduction type of that of the light emitting device according to this embodiment.

On the other hand, there are formed, on the GaAs substrate 120, an n-type GaAs contact layer 124, an n-type InGaAlP current spreading layer 126, an n-type cladding layer 128, a light emitting layer 130, a p-type outer barrier layer 132, a p-type InAlP cladding layer 134, and a p-type InGaP bonding layer 136, in this order, by using the crystal growth process.

The p-type GaP bonding layer 112, formed on the p-type GaP substrate 110, and the p-type InGaP bonding layer 136 are opposed, and bonded by heating at 400° C. in a hydrogen gas atmosphere. Next, the GaAs substrate is removed by using solution etching method, for example. Furthermore, the ohmic contact can be formed at the bonding interface 170 by heat treatment process of about 770° C. However, because the impurity such as Zn easily diffuses in the heat treatment process of 770° C., deterioration of crystallinity is easily induced near the light emitting layer 130. Therefore, the brightness may fall by approximately 20% in the case of the red light and by approximately 40% in the case of the green to yellow light.

On the contrast, in this embodiment, the crystal growth of the upper growth layer 39, including the light emitting layer 32, can be performed after forming the first binding layer 20 on the GaP substrate 10. That is, because the upper growth layer 39 does not pass the high temperature bonding process, it can be prevented that such impurity as Zn diffuses near the light emitting layer 32. And the high quality crystal can be more easily obtained because the upper growth layer 39, of which lattice approximately fits to GaAs, is formed on the first bonding layer 20, of which the lattice is approximately fits to GaAs.

Next explained is the carrier concentration of the GaP substrate 10 for light emitting device according to this embodiment.

Figure 10A:
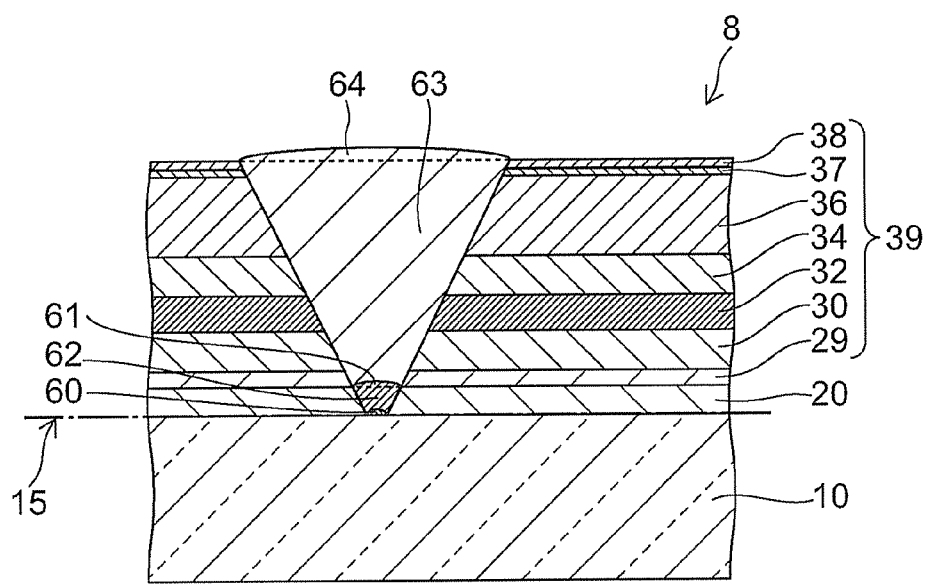
FIGS. 10A to 10C are views explaining surface hillocks.
Figure 10B:
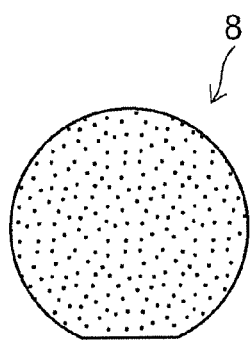
Figure 10C:
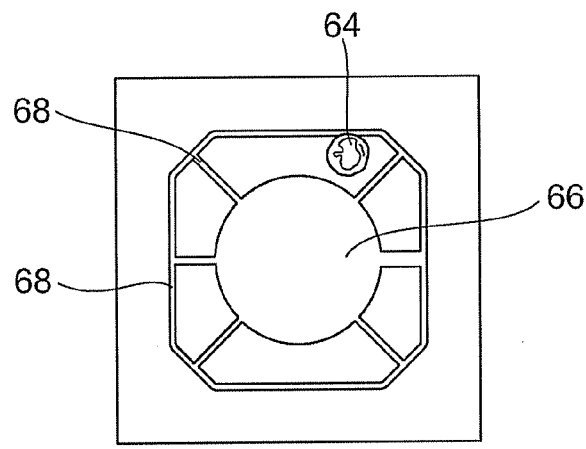

FIGS. 10A to 10C are views explaining hillocks induced in the epitaxial growth process. That is, FIG. 10A a cross-sectional view of the epitaxial wafer, FIG. 10B is a plan view of the epitaxial wafer surface, and FIG. 10C is a plan view of the chip.

When the GaP substrate 10 has higher carrier concentration, an interstitial atom, which does not contribute to an n-type impurity, exists and functions as the crystal defect. This crystal defect 60 can be a starting point on the GaP substrate 10, and a void region including a micro cavity can be easily induced in the first bonding layer 20. After removing the GaAs substrate 28 and the buffer layers 24, 26, the hillock 61 is induced due to void on the second face 20b, which is a boss having a diameter of several μm and of which crystal orientation deviates from normal direction.

In the crystal growth process of the upper growth layer 39, a polycrystalline region 63 is easily formed in the upper growth layer 39 on the hillock 61. Because the upper growth layer 39 is about 4 μm thick, a diameter of a hillock 64 may expand to 10 μm or more in some cases. FIG. 10B is an example of hillock distribution on the surface of the epitaxial wafer 8.

Because the light can not be emitted and a leak current becomes as high as about 100 μA at reverse voltage of 4 V in the polycrystalline region 63, the characteristics become defective, resulting in low production yield. Furthermore, as shown in FIG. 10C, if the hillock is induced near the narrow electrode 68, the breaking of the narrow electrode 68 is easily induced, resulting in lower brightness.

By contrast, in the comparative example shown in FIG. 9, although the crystal defects 121 exist on the GaAs substrate 120, the defect density is lower than that of the GaP substrate. And also, because the lattice fitting growth layer is formed, it becomes easy to prevent the expansion of the polycrystalline region due to the void.

Figure 11:
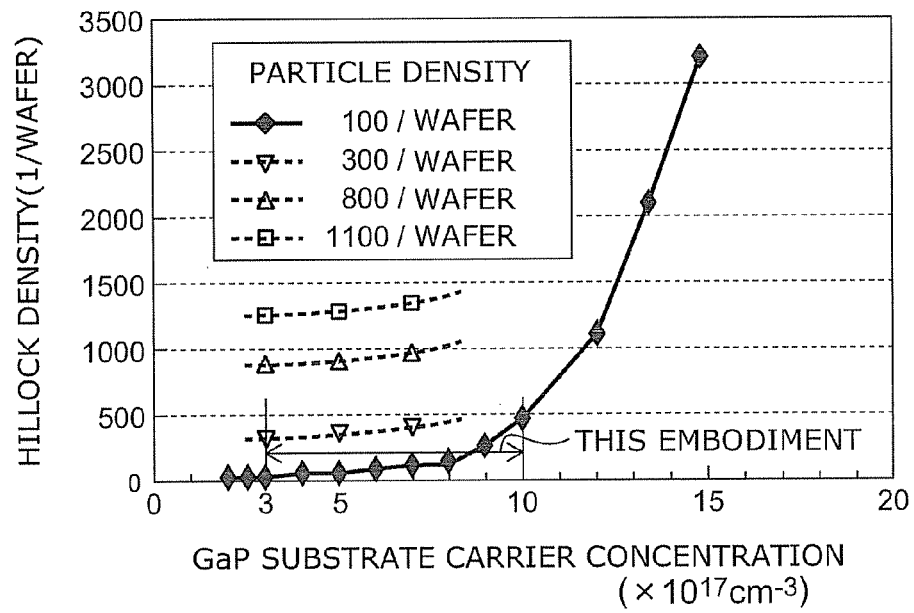
FIG. 11 is a graphical diagram representing the dependence of hillock-density on the substrate carrier concentration.

FIG. 11 is a graphical diagram representing the dependence of hillock density on the substrate carrier concentration after crystal growth in accordance with the particle density before crystal growth on 2 inch wafer.

The vertical axis represents hillock density (number/wafer) on the surface of the upper growth layer 39, and the horizontal axis represents the carrier concentration ($cm^{-3}$) of the GaP substrate 10. In this case, the surface of the GaP substrate is mirror finished, and kept clean by washing before crystal growth. Therefore, the adhesion of the particles can be avoided. Thus, the symbol ◆ represents the density of hillock having a diameter 0.3 μm or more on the surface of the GaP substrate 10, in the case of particles being as low as 100/wafer or less.

Although the hillocks and the particles are in indeterminate shapes in many cases, the size of the hillock and the particle is represented by a "diameter" of the circle having the same area as the hillock and the particle in a plan view of the epitaxial wafer in this specification. The hillock density in FIG. 11 is represented by the hillock numbers having a "diameter" of 10 pm or more on the surface of the 2 inch epitaxial wafer 8. Moreover, in the case of 3 inch wafer size, the density can be converted into that of 2 inch wafer size in accordance with the effective area ratio.

The hillock density represented by the symbol ◆ was approximately 490/(2-inch wafer) in the center value of carrier density of $1 \times 10^{18}$ $cm^{-3}$, and increased in higher concentration. Moreover, the initial percent defective (%) for the light emitting devices are represented in Table. 2, by the investigation of the light emitting device formed on the epitaxial wafer having the center value of the concentration of $3 \times 10^{17}$ to $1.45 \times 10^{18}$ $cm^{-3}$.

TABLE 2

| WAFER No | CENTER VALUE OF CARRIER CONCENTRATION ($\times 10^{17}$ $cm^{-3}$) | HILLOCK DENSITY (1/WAFER) | PERCENT DEFECTIVE (%) |
|---|---|---|---|
| 1 | 3 | 35 | LESS THAN 1% |
| 2 | 5 | 40 | |
| 3 | 6 | 50 | |
| 4 | 7 | 100 | |
| 5 | 8 | 150 | |
| 6 | 9 | 280 | |
| 7 | 10 | 490 | |
| 8 | 12 | 1100 | ABOUT 10% |
| 9 | 13.5 | 2100 | |
| 10 | 14.5 | 3200 | |

In this case, the dependence of the hillock density on the center value of the concentration is represented in FIG. 11. The benchmark for the initial defect is lower brightness (or lower light intensity), and leak current higher than 100 μA or more at reversed 4 volts. Lower brightness is induced by non-radiation in the polycrystalline region 63, the break of the narrow electrode 68 and so on.

The light emitting devices according to this embodiment are represented by the wafer of No. 1 to No. 7 of which the center value of the carrier concentration of $3 \times 10^{17}$ to $1 \times 10^{18}$ $cm^{-3}$. Average percent defectives in these wafers could be less than 1%, resulting in higher chip yield. By contrast, the group of wafer of No. 8, No. 9 and No. 10, correspond the center of the carrier concentration of $1.2 \times 10^{18}$ to $1.45 \times 10^{18}$ $cm^{-3}$. Average percent defectives were as high as approximately 10%, and it became difficult to achieve higher chip yield. Moreover, the average brightness of the group of No. 8, No. 9, and No. 10 was by 20% or more lower than that of the group of No. 1 to No. 7. Therefore, it was difficult to keep desired brightness.

Moreover, in FIG. 11, the symbol ∇ represents density of hillock having a diameter of 0.3 μm or more on the surface of the GaP substrate 10, in the case of particles having about 300/wafer, the symbol Δ represents the hillock density in the case of particles having about 800/wafer, and the symbol □ represents the hillock density in the case of particles having about 1100/wafer by the broken lines, respectively. As shown in this figure, the higher the particle density, the higher the hillock density. For example, in the case of particles having 1100/wafer, hillock density became as high as 1300/wafer, in the GaP substrate of carrier concentration of $3 \times 10^{17}$ $cm^{-3}$. It became difficult to keep the initial defect rate low like less than 1% in such higher hillock density. Therefore, it is preferred that the particle density is kept less than 100/wafer, for example. Thus, there is provided a semiconductor light emitting device having higher intensity. And there is provided a method for manufacturing the semiconductor light emitting device capable of achieving higher yield and mass productivity.

Moreover, because the ohmic resistance increases and the forward voltage of the light emitting diode becomes higher at carrier concentration lower than $3 \times 10^{17}$ $cm^{-3}$, it is preferable that the carrier concentration is $3 \times 10^{17}$ $cm^{-3}$ or more.

Figure 12:
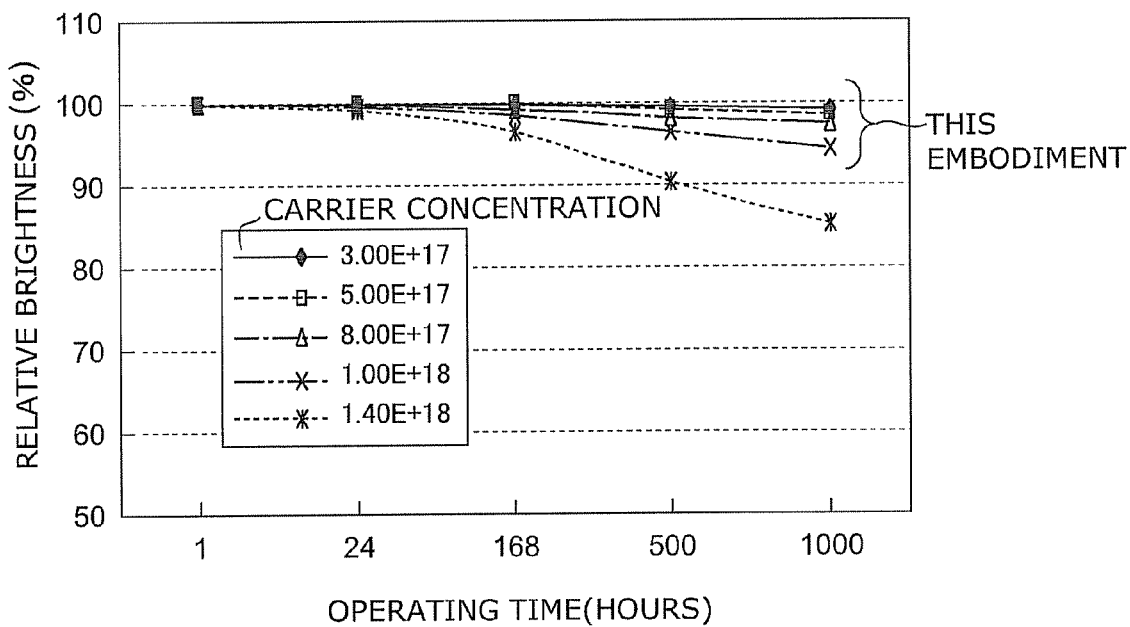
FIG. 12 is a graphical diagram showing a brightness variation.

FIG. 12 is a graphical diagram showing brightness variation with operating time. The vertical axis represents average relative brightness (%), and the horizontal axis represents operating time (hour). The operation temperature is the room temperature and the operation current is 50 mA.

The average relative brightness fell to about 85% after operating time of 1000 hours in the center value of carrier concentration of $1.4 \times 10^{18}$ $cm^{-3}$ in the GaP substrate 10. This is because crystal defects, such as a point defect, dislocation, stacking fault, and so on, due to higher concentration in the GaP substrate 10 increase in the light emitting layer 32, and these crystal defects further expand with the operating period due to non radiant recombination of injected carrier.

On the contrast, average relative brightness was maintained 94% or more of the initial value after the operating time of 1000 hours in this embodiment in which the center value of carrier concentration of $1 \times 10^{18}$ $cm^{-3}$ or less. Moreover, as the carrier concentration lowered, variation rate of average brightness could be reduced. For example, in carrier concentration of $3 \times 10^{17}$ $cm^{-3}$, average relative brightness is maintained 99% or more of the initial value, and the variation is very small after the operating time of 1000 hours. Thus, variation of brightness can be easily prevented in this embodiment in which the carrier concentration is $1 \times 10^{18}$ $cm^{-3}$ or less. Therefore, the light emitting device according to this embodiment can be used in applications in which stable operation is required for long period.

Figure 13A:
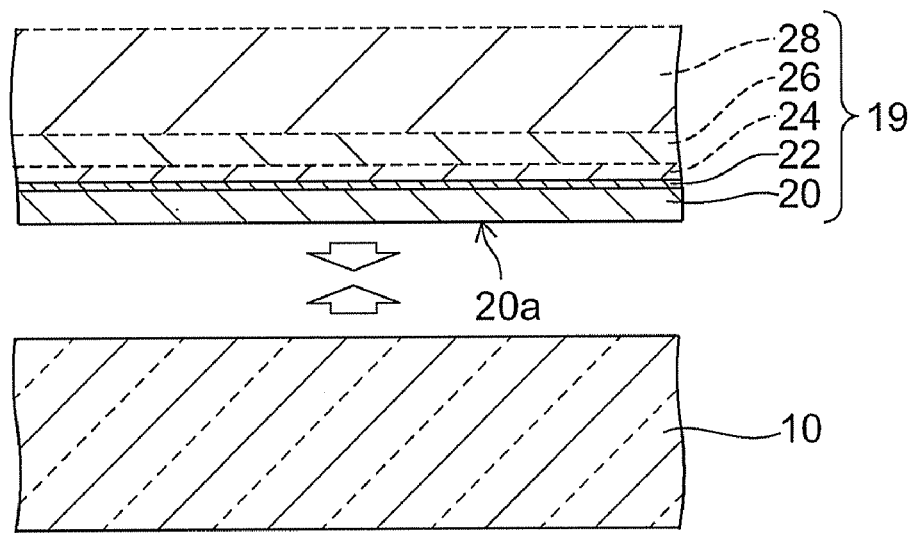
FIGS. 13A and 13B are views explaining a semiconductor light emitting device according to a first modified example of the second embodiment.
Figure 13B:
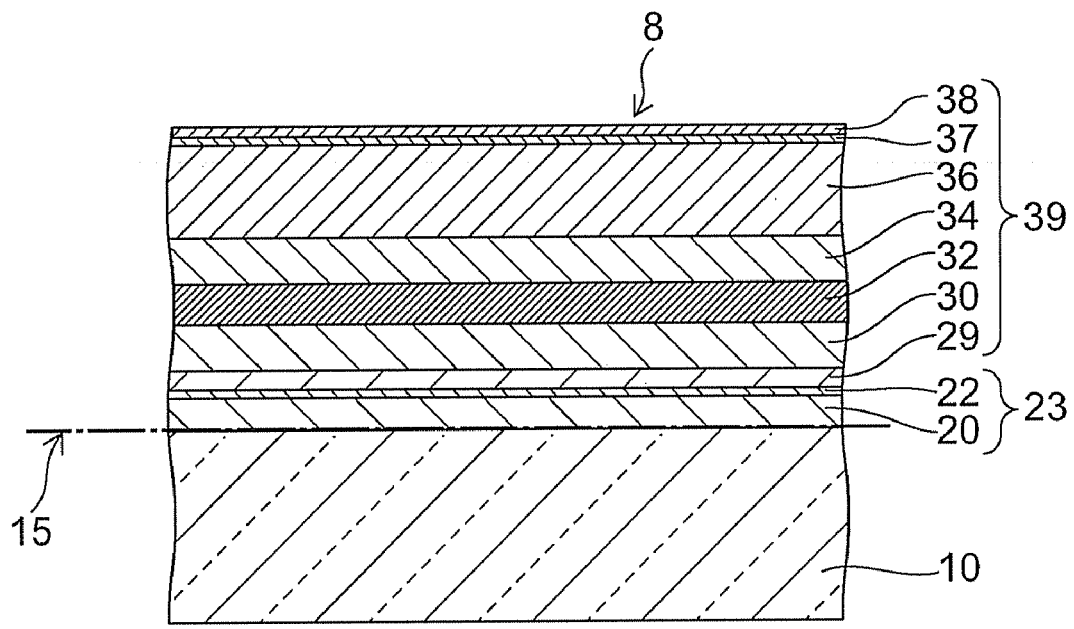

FIGS. 13A and 13B are views explaining a semiconductor light emitting device according to a first modified example of the second embodiment. That is, FIG. 13A is a view explaining the bonding process, and FIG. 13B is a cross-sectional view of an epitaxial wafer after forming the upper growth layer.

In this modified example, there are formed, on the GaAs substrate 28, an InGaP buffer layer 26, an $In_{0.5}(Ga_{0.3}Al_{0.7})_{0.5}P$ buffer layer 24 (T=50 nm), an n-type GaAs surface controlling layer 22 (T=10 nm, N=4×10$^{17}$ cm$^{-3}$), and an n-type $In_{0.5}(Ga_{0.5}Al_{0.5})_{0.5}P$ first bonding layer 20 (T=0.3 μm, N=4×10$^{17}$ cm$^{-3}$), in this order.

Although the first bonding layer 20 has an n-type $In_{0.5}(Ga_{0.5}Al_{0.5})_{0.5}P$ layer, In easily aggregates and P easily evaporates. That is, in crystal growth process, the surface of the first bonding layer 20 is exposed and the constitution ratio may vary from the above formula. When the upper growth layer 39, made of InGaAlP-based semiconductor, is formed on the first bonding layer 20 having varied constitution ratio, crystal defects increase. Increase of crystal defects results in the fall of the brightness, especially after long operating time.

If the upper growth layer 39 is formed on the surface controlling layer 22, made of thin III-V group compound semiconductor, which includes at least Ga and As, but does not substantially include In and P, the upper growth layer 39, in which InGaAlP constitution ratio is stable and crystal defects are reduced, can be obtained. In this case, because the surface controlling layer 22 fits approximately to GaAs lattice, the lattice deviation to the upper growth layer 39 is smaller than that between the GaP substrate 10 and the first bonding layer 20.

If the thickness of the surface controlling layer 22, made of GaAs, is not more than 70 nm, optical absorption in wavelength of visual to ultra red light can be sufficiently small, and crystallinity can be much improved. In this case, the foundation layer 23 between the GaP substrate 10 and the upper growth layer 39 has the surface controlling layer 22 and the first bonding layer 20.

FIGS. 14A to 14C are views explaining a semiconductor light emitting device according to a second modified example of the second embodiment. That is, FIG. 14A is a view explaining the bonding process, FIG. 14B is a cross-sectional view of an epitaxial wafer, and FIG. 14C is a cross-sectional view of the light emitting device.

In this modified example, there are formed, on the GaAs substrate 28, an InGaP buffer layer 26, an $In_{0.5}(Ga_{0.3}Al_{0.7})_{0.5}P$ buffer layer 24 (T=50 nm), an n-type GaAs surface controlling layer 22 (T=10 nm, N=4×10$^{17}$ cm$^{-3}$), an n-type $In_{0.5}(Ga_{0.5}Al_{0.5})_{0.5}P$ first bonding layer 20 (T=0.3 μm, N=4×10$^{17}$ cm$^{-3}$), and an n-type $In_{0.5}Ga_{0.5}P$ second bonding layer 21 (T=0.02 μm, N=6×10$^{18}$ cm$^{-3}$), in this order, where T is film thickness and N is concentration.

On the other hand, there are formed, an n-type GaP substrate 10, an n-type GaP third bonding layer 12 (T=0.2 μm, N=6×10$^{18}$ cm$^{-3}$) by using MOCVD or MBE method, for example.

In this bonding process, it becomes easy that ohmic resistance is lowered near the bonding interface, and therefore, the operation voltage is reduced if carrier concentrations of the second and third bonding layer 21, 12 become higher. In this case, the foundation layer 23, between the GaP substrate 10 and the upper growth layer 39, is composed of the surface controlling layer 22, the first bonding layer 21, and the third bonding layer 12. Moreover, because the surface controlling layer 22 fits approximately to GaAs lattice, lattice deviation to the upper growth layer 39 is smaller than that between the GaP substrate 10 and the first bonding layer 20.

In this embodiment, although the conduction type of the GaP substrate 10 is n-type, this invention is not limited thereto. The p-type substrate may be used. If impurity concentration of the p-type GaP substrate is as high as 5×10$^{17}$ to 2×10$^{18}$ cm$^{-3}$ in order to maintain good conductivity, optical absorption increases, and therefore, optical power falls. By contrast, even if impurity concentration of the n-type GaP substrate is as low as 3×10$^{17}$ to 1×10$^{18}$ cm$^{-3}$, conductivity thereof is maintained high and optical absorption can be reduced, preferably.

In these embodiments and the associated modified examples, it is assumed that the light emitting layer 32 is made of InGaAlP-based semiconductors and wavelength of the radiant light therefrom is within the range of visual light. Also, the "InGaAlP" is the material represented by a composition formula of $In_x(Ga_yAl_{1-y})_{1-x}P$ (0≦x≦1, 0≦y≦1), includes the semiconductor to which p-type and n-type impurities are added.

However, the invention is not limited thereto. For example, the light emitting layer may be made of GaAlAs-based semiconductor and wavelength of the radiant light the may be within the range of ultra red light. In this case, the "GaAlAs" is the material represented by a composition formula of $Ga_wAl_{1-w}As$ (0≦w≦1) and may include the semiconductor to which p-type and n-type impurities are added.

The light emitting device according to these embodiments of the invention can radiate high intensity visual light such as red, orange, yellow, yellow-green, and green, and therefore, can be widely used in such applications as lighting apparatus, car-use lighting equipment, display device, traffic signal, and so on. Thus, outdoor applications can extend, and also low consumption power becomes possible due to a reduction of an operating current.

As described above, with reference to drawings, embodiments of the invention have been explained. However, the invention is not limited to the embodiment. With respect to material, size, shape, arrangement and so forth of the GaP substrate, the tentative substrate, the foundation substrate, the bonding layer, the surface controlling layer, the buffer layer, and the upper growth layer which compose this invention, if design modification is performed by those skilled in the art, such modified invention is also included in the scope of this invention as long as not departing from the spirits of this invention.

The invention claimed is:

1. A semiconductor light emitting device comprising:
   an upper growth layer including a light emitting layer;
   a transparent substrate through which a radiant light from the light emitting layer passes; and
   a foundation layer provided between the upper growth layer and the transparent substrate, the foundation layer having a surface-controlling layer and a bonding layer bonded with the transparent substrate,
   the surface-controlling layer being made of compound semiconductor including at least Ga and As, but none of In, Al, and P substantially,
   the upper growth layer being formed on an upper surface of the surface-controlling layer, and
   a lattice constant difference at an interface between the surface-controlling layer and the upper growth layer being smaller than that at an interface between the bonding layer and the transparent substrate.

2. A semiconductor light emitting device comprising:
   an upper growth layer including a light emitting layer;
   a transparent substrate through which a radiant light from the light emitting layer passes, wherein the transparent substrate is made of GaP; and
   a foundation layer provided between the upper growth layer and the transparent substrate, the foundation layer having a surface-controlling layer and a bonding layer bonded with the transparent substrate, wherein the surface-controlling layer is made of GaAs, but none of In, Al, and P substantially, the bonding layer is made of InGaAlP, the upper growth layer being formed on an upper surface of the surface-controlling layer and the upper growth layer includes InGaAlP, and a lattice constant difference at an interface between the surface-controlling layer and the upper growth layer being smaller than that at an interface between the bonding layer and the transparent substrate.

3. The semiconductor light emitting device according to claim 2, wherein the light emitting layer is made of InGaAlP.

4. The semiconductor light emitting device according to claim 2, wherein the upper growth layer has a GaAs contact layer on a top surface thereof, the contact layer forming ohmic contact with an electrode.

5. The semiconductor light emitting device according to claim 2, wherein a thickness of the surface controlling layer is not more than 70 nm.

* * * * *